（12) United States Patent
Thurnhofer (10) Patent No.: US 6,601,215 B1
(45) Date of Patent: Jul. 29, 2003

(54) TRACEBACK BUFFER MANAGEMENT FOR VLSI VITERBI DECODERS

(75) Inventor: Stefan Thurnhofer, Newport Beach, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/495,554

(22) Filed: Feb. 1, 2000

(51) Int. Cl.[7] ............................................. H03M 13/41
(52) U.S. Cl. ...................................................... 714/795
(58) Field of Search ......................................... 714/795

(56) References Cited

U.S. PATENT DOCUMENTS

| | | | | |
|---|---|---|---|---|
| 4,777,636 A | * | 10/1988 | Yamashita et al. | 714/795 |
| 4,905,317 A | * | 2/1990 | Suzuki et al. | 341/51 |
| 5,533,065 A | * | 7/1996 | Blaker et al. | 375/341 |
| 5,712,880 A | * | 1/1998 | Rim et al. | 365/221 |
| 5,822,341 A | * | 10/1998 | Winterrowd et al. | 714/786 |
| 5,828,675 A | * | 10/1998 | Chen et al. | 375/262 |
| 5,946,361 A | * | 8/1999 | Araki et al. | 375/341 |
| 5,970,097 A | * | 10/1999 | Ishikawa et al. | 375/262 |
| 5,996,112 A | * | 11/1999 | Dabiri et al. | 375/341 |
| 6,337,890 B1 | * | 1/2002 | Maru | 375/262 |

OTHER PUBLICATIONS

Kirkland et al., "High–Speed Viterbi Decoder Memory Design", Canadian Journal of Electrical and Computer Engineering, vol. 15, No. 3, 1990, pp. 107–114.*

Cypher et al., "Generalized Trace Back Techniques for Survivor Memory Management in the Viterbi Decoder", GLOBECOM '90, 1990, pp. 1318–1322.*

Fettweis, "Algebraic Survivor Memory Management for Viterbi Detectors", SUPERCOMM/ICC '92, 1992, pp. 339–343.*

Feygin et al., "Architectural Tradeoffs for Survivor Sequence Memory Management in Viterbi Decoders", IEEE Transactions on Communications, vol. 41, No. 3, Mar. 1993, pp. 425–429.*

Horwitz et al., "A Generalized Design Technique for Traceback Survivor Memory Management in Viterbi Decoders", COMSIG '97, 1997, pp. 63–68.*

* cited by examiner

Primary Examiner—Stephen M. Baker
(74) Attorney, Agent, or Firm—Steve Mendelsohn (57) ABSTRACT

This invention concerns a novel traceback memory management method and apparatus in which a memory stores Viterbi trellis state records and shifts the records in a manner so that the memory mirrors the relevant portion of the trellis accessed during the traceback for error correction and decoding. Several pointers are used so that a random access memory (RAM) can store and access the Viterbi trellis state records with only a minimum amount of hardware required to implement the memory accesses. In certain instances, where memory length is a power of 2, entire elements needed in the address generation steps are eliminated by the invention, thereby saving valuable chip area and clock cycles.

15 Claims, 6 Drawing Sheets

TRACEBACK BUFFER MANAGEMENT FOR VLSI VITERBI DECODERS

BACKGROUND OF THE INVENTION

1. Field of the Invention

This invention relates, in general, to a method and apparatus for decoding convolutionally-encoded signals. More specifically, the invention relates to a traceback method and apparatus for Viterbi decoding.

2. Description of the Relevant Art

Digital signal processing algorithms are characterized by repetitive accesses to data, especially at the input end of a processing chain. Decoding of convolutionally-encoded signals is a typical example of such repeating address patterns. The need for speed and compactness imposed by real-time signal processing applications often requires the use of special structures that exploit this regularity to accelerate the generation of addresses. In software, this may involve placing coefficients in memory in order of use, so that simple address increment operations can access them. Alternatively, simple hardware logic can be developed to implement address generation.

One way of achieving regular, repetitive addressing is through the use of a circular buffer. The circular buffer is used for cases in which limited amounts of data are accessed in sequence over and over. For example, filter coefficients are accessed in sequence to multiply a consecutive set of samples, and then the samples are shifted by one and the same set of filter coefficients are again accessed. The address cycle may proceed in increments of one and reset to zero after reaching a maximum value of $N-1$, thereby implementing a modulo N counter. Alternatively, the address cycle may increment by a number $m>1$, implementing a striding memory that accesses every mth location until exceeding $N-1$, then resetting either back to zero or to the remainder of the quotient $N/m$. If N is an integer power of two, $N=2^i$, a simple hardware solution can pick the least significant i bits of a counter to provide modulo N cycling. In software, simple bit masking by means of a logical AND can be used for modulo address generation.

In the Viterbi algorithm, an important set of operations is the sequence of choosing a minimum from N numbers, identifying the argmin, or index of the minimum number, adding the minimum to an accumulating distance score, and passing back the argmin and updated distance score. Typically N numbers that correspond to distance values are received and the minimum values s' and the index of that minimum value, t', are calculated. Alternatively, the distance measure, which is small for similar patterns, could be replaced by a similarity measure, which increases as two patterns become identical, and the min function would be replaced by a max function. The minimum distance s' is added to a global distance that is the accumulation of many such operations in the past from the scoring of other recognition subunits and the global distance is thus updated. The argmin is sent to a linked list structure.

Viterbi decoders are used heavily in communications applications for Forward Error Correction (FEC). They undo the encoding of convolutional encoders and correct bit errors. An essential part of the Viterbi decoder is a traceback memory (TM). It stores information about decisions made by an Add-Compare-Select Unit (ACSU). For each state of the Viterbi trellis, the TM contains a circular buffer. The ACSU writes the decision information into the TM, and a Traceback Unit reads that information from the TM and decodes the bit stream.

Heretofore, the TM required separate circular buffers for each state of the Viterbi trellis. For each buffer, a start and an end address needed to be stored. Accesses to these buffers require an address generation unit that checks for overflow and maintains the circular structure. This address generation is costly both in terms of silicon area as well as cycle count.

SUMMARY OF THE INVENTION

Accordingly, the present invention is directed to a Viterbi decoding method and apparatus that substantially obviates one or more of the problems due to limitations and disadvantages of the related art. Additional features and advantages of the invention will be set forth in the description which follows, and in part will be apparent from the description, or may be learned by practice of the invention. The objectives and other advantages of the invention will be realized and attained by the method and apparatus particularly pointed out in the written description and claims hereof, as well as the appended drawings.

To achieve these and other advantages, and in accordance with the purpose of the invention as embodied and broadly described, there is provided apparatus for Viterbi decoding of an encoded signal represented as a time-sequence of coded symbols. The apparatus includes a processor receiving the encoded signal and generating therefrom a time-sequence of trellis-state decision records; a buffer receiving and storing in an array the time-sequence of trellis-state decision records, the buffer time-sequence shifting in the array a plurality of the time-sequence of trellis-state decision records; and a traceback unit operatively connected to the buffer tracing back a path in the array representing a most-likely survivor path and generating therefrom a decoded signal.

In another aspect of the apparatus, the buffer comprises a plurality of indexed-buffer registers each storing a predetermined one of the plurality of trellis-state decision records, each such indexed-buffer register responsive to a first (GSP) and a second (WRITEP) write pointer signal; the first write pointer signal pointing to one of the plurality of indexed-buffer registers as the shifted starting point of the time-sequence array and the second write pointer signal pointing to the index within each of the buffer registers for storage of the trellis-state decision records.

In yet another aspect of the apparatus, the first write pointer is incremented by a fixed predetermined value. Also in another aspect of the apparatus, the second write pointer is incremented by a fixed predetermined value after each trellis-state decision is generated by the processor.

In another aspect of the apparatus, the buffer is further responsive to a read pointer signal (READP) generated by the traceback unit pointing to the trellis-state decision being read; the READP being formed from a state number of the trellis-state and a read base signal (RBASE).

Also in another aspect of the invention, the read base signal is decremented by a fixed predetermined value.

In another aspect of the apparatus, the memory length of indexed-buffer registers, M, is a power of 2 and wherein said second write pointer predetermined fixed incrementing value is register size N. Also in another aspect of the apparatus, the total memory length, M, is not a power of 2, and wherein said second write pointer is set to the remainder after subtracting M, if a subtraction therefrom by M produces a positive or zero result. Also in another aspect of the apparatus, the subtraction is performed by modulo ($2^{N+1}$) addition of the value $-N$.

In yet another aspect of the apparatus, the buffer is a random access memory (RAM).

Also, in accordance with the invention, there is provided a method of Viterbi decoding of an encoded signal represented as a time-sequence of coded symbols, having, the steps of generating from the encoded signals a time-sequence of trellis-state decision records, storing the records in an array, generating a decoded symbol from traceback paths in the array, and shifting pointers for the records in the array.

In another aspect of the method, the array comprises a plurality of indexed-buffer registers each storing a predetermined one of the trellis-state decision records, each such indexed-buffer register responsive to a first write pointer (GSP) signal and a second write pointer (WRITEP) signal; the first write pointer signal pointing to one of the plurality of indexed-buffer registers as the shifted starting point of the time-sequence array and the second write pointer signal pointing to the index within each of the buffer registers for storage of the trellis-state decision records, wherein the shifting step comprises the steps of incrementing the first write pointer by a fixed predetermined value each time a bit is decoded, and incrementing the second write pointer by a fixed predetermined value after the trellis-state decision is generated.

In another aspect of the Viterbi decoding method, the memory length N, is a power of 2. Also, in another aspect of the method, the memory length, N is not a power of 2, wherein the second write pointer incrementation step calls for incrementing by the register size, and the time-sequence shifting step further includes the step of setting the second write pointer to the remainder after subtraction M, if a subtraction therefrom by N produces a negative result. In another aspect of the method, the subtraction is performed by modulo $2^{N+1}$ addition of the value -N.

Additionally, in accordance with the invention, there is provided apparatus for traceback buffer management and generation of decoded signals, length of the buffer does not have to equal (TBL). The apparatus includes a control, a traceback memory (TM) having in one embodiment a read port and a write port, and in another embodiment a read/write port, arranged as a plurality of buffers, each a predetermined length (TBL), a write address unit connected to the TM write port and responsive to the control, generating a local write pointer signal to a selected buffer in the TM; and a read address unit connected to the TM read port and responsive to the control, generating a read pointer signal for the generation of decoded signals.

In another aspect of the invention, the TM is a RAM.

In another aspect of the apparatus, the Traceback memory management apparatus further includes a global start pointer (GSP) register responsive to the control and wherein the read address unit includes a read base address (RBASE) register responsive to the control; wherein the RBASE register is decremented after each trellis-state transition is processed during trace elements and wherein the generation of a decoded signal occurs when the contents of the RBASE register equals the contents of the GSP register.

In another aspect of the apparatus, the write address unit comprises a write address register storing the write address pointer signal; a buffer length register; a first adder having an output connected to the write address register, receiving the write address pointer signal and the buffer length signal and generating therefrom an updated write address pointer signal; a write base address register storing a write base pointer signal received from the control; and a second adder having an output connected to the write base address register, receiving the write base pointer signal and the first predetermined incrementing value signal and generating therefrom an updated write base address signal, wherein the control operatively selects the local write pointer signal from the output of the write address pointer signal or the output of the write base address register.

In another aspect of the Traceback memory management apparatus wherein the value memory length is a power of 2, the read address unit further includes a read address register storing the read pointer signal; a register for left-shifting and storing a trellis-state number value; a first adder having an output connected to the read address register, receiving the read address pointer signal and receiving the shifted trellis-state signal and generating therefrom an updated read address pointer signal; a multiplexer receiving the signal stored in the write base address register and the signal stored in the read base address (RBASE) register, the control operatively selecting therefrom a signal to be generated; and a second adder having an output connected to the read base address (RBASE) register, receiving the signal generated by the multiplexer and a predetermined decrementing value signal and generating therefrom an updated read base address signal.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

The Viterbi algorithm is best understood in terms of the finite state machine familiar to those schooled in sequential logic. The motivation for using the state machine as a way to simplify the representation of a system in which the current output is a function of the history of past inputs. Instead of keeping track of the entire past sequence of samples to determine what the next sample should be, the results of the past inputs place the system in a particular state. The current input and the current state then determine both an emitted symbol which is the basis for what is observed, and the next state.

Figure 1:
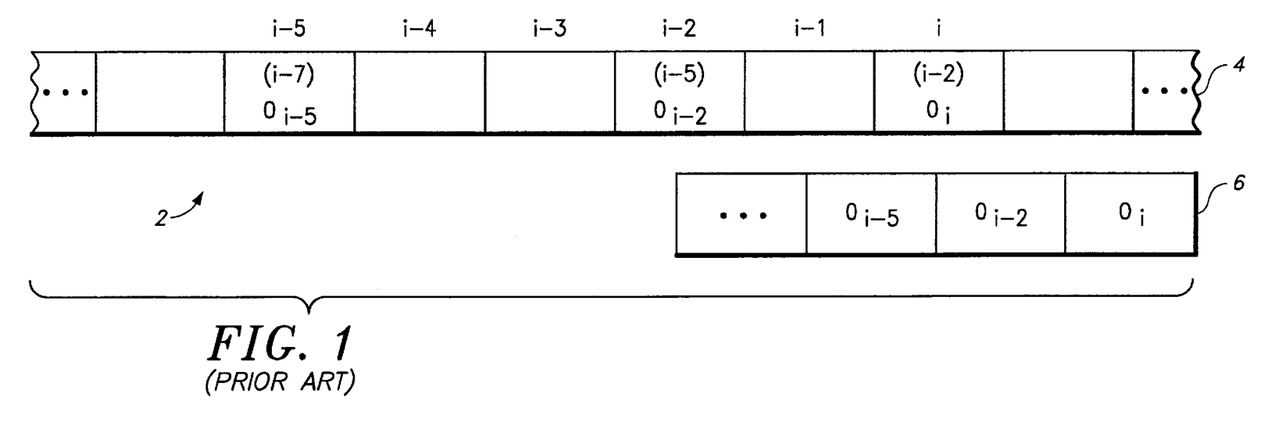
FIG. 1 shows a Traceback structure.
Figure 2:
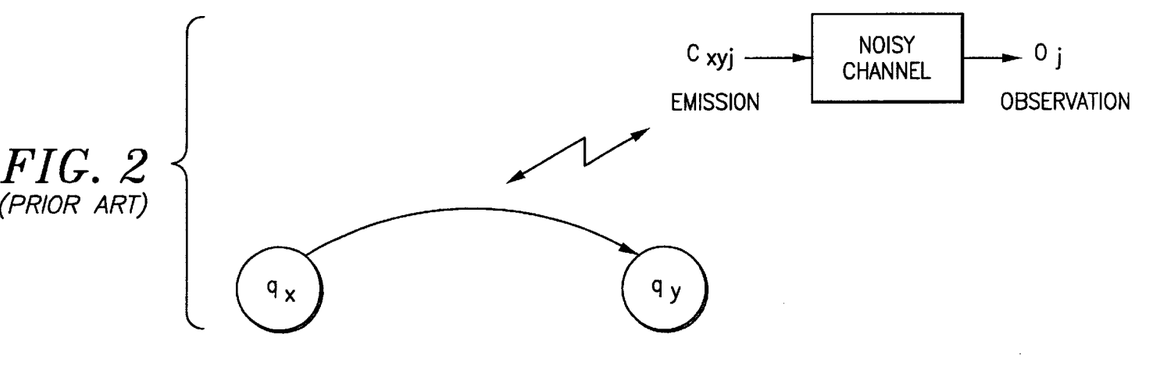
FIG. 2 shows a transition in encoder state resulting in an emission of symbol $C_{xyj}$ and observed symbol $O_j$.

At any instant of time, the encoder is in one of K possible different states, and at each instant of time, the system transitions into another (or possibly the same) state. Associated with each transition is the emission of a symbol $C_{xy}$, denoting the symbol emitted upon transition from state x to state y. This symbol is subjected to corruption from various sources of noise, during transmission over a channel. The resulting observation at time j is derived from this symbol passing through the noisy channel and is represented as $O_j$. Because we do not know the state transitions that led to observation $O_j$, $O_j$ does not include the indices of state transitions x,y. FIG. 2 represents the process of a state transition, an emitted symbol, the corruption of the symbol due to a noisy channel, and the resulting observation at time j.

The problem that the Viterbi algorithm addresses is: given a sequence of noisy observations $O=\{O_1, O_2, \ldots, O_j\}$ find the underlying state sequence $q=\{q_1, q_2, \ldots, q_j\}$ that best explains O. Put in more formal probabilistic terms, given a sequence O of observations of a discrete time finite state Markov process in memoryless noise, find the state sequence q for which the a posteriori probability P(q|O)is maximum.

In this notation, time j progresses from j=O to j=J, and at time j, the encoder system is in a state $q_j$. There are a total of K possible states, numbered by index k,k=1, 2 . . . , K. As time progresses from O to J, the system moves through a sequence of states given by $q=(q_o, q_1, \ldots, q_j)$. An initial state $q_o$ may be explicitly defined. (Alternatively, $q_O$ may be governed by a probability density function $\pi_m$ that indicates the probability of each state $q_m$ serving as the initial state.

Figure 3A:
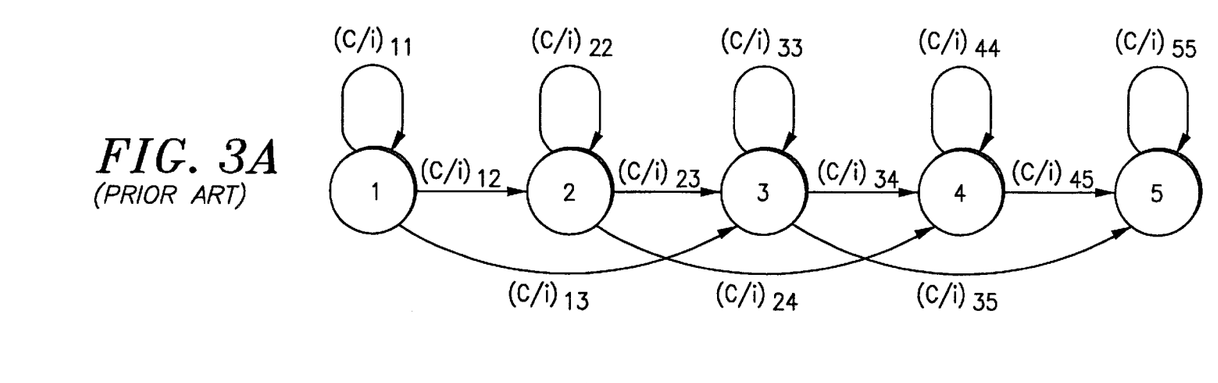
FIG. 3(a) is a state diagram of a five-state process.

To define the finite state system, one defines the symbol emitted from state q at time j, and the next state that the system transitions to from its current state, $q_j$, $q_j+1$. The output and the next state are determined by separate functions that depend on both the current state and the current input. The state diagram may be used to specify these relationships. In FIG. 3(a), a five-state process is diagrammed. Each node (circle) represents a state, and each arc (arrow) represents a transition. Each arc is labeled with a pair of numbers, $(C/i)_{xy}$. The input (i) indicates that this transition out of a state a to state b results from receipt of input i, and the transition is accompanied by the emission of symbol C. Thus, the emission of symbol 2 and transition from state 3 to state 4 upon receipt of input 1 would be shown as (2/1)34.

Figure 3B:
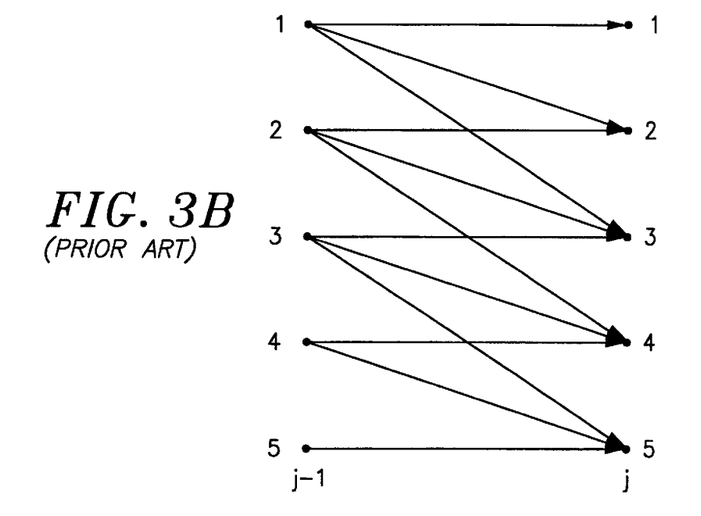
FIG. 3(b) is a lattice diagram of the five-state process of FIG. 3(a)

FIG. 3(b) shows the allowed transitions in the form of a lattice. Each state k, k=1,2, . . . , 5, is listed vertically, and time runs horizontally. Arrows show transitions out of each state at time j−1 on the left to a new state at time j on the right. Inspection of FIG. 3(b) shows that each state on the right has a subset of the set of states on the left that contains its allowable predecessors. The set of allowed predecessor states that lead into state k is given by the range a(k). In this example, a(2)={1,2}.

One of the parameters of a Viterbi process is the particular state diagram that is used. Although FIG. 3(b) shows a model that progresses from lower-numbered to higher-numbered states (known as a left-to-right model), any other combination of state interconnection could be used, including one that allows transition from any state to any other state (known as an ergodic model). However, left-to-right models are typically used for modeling time-sequenced processes such as speech, so the following description is of this type.

Figure 3C:
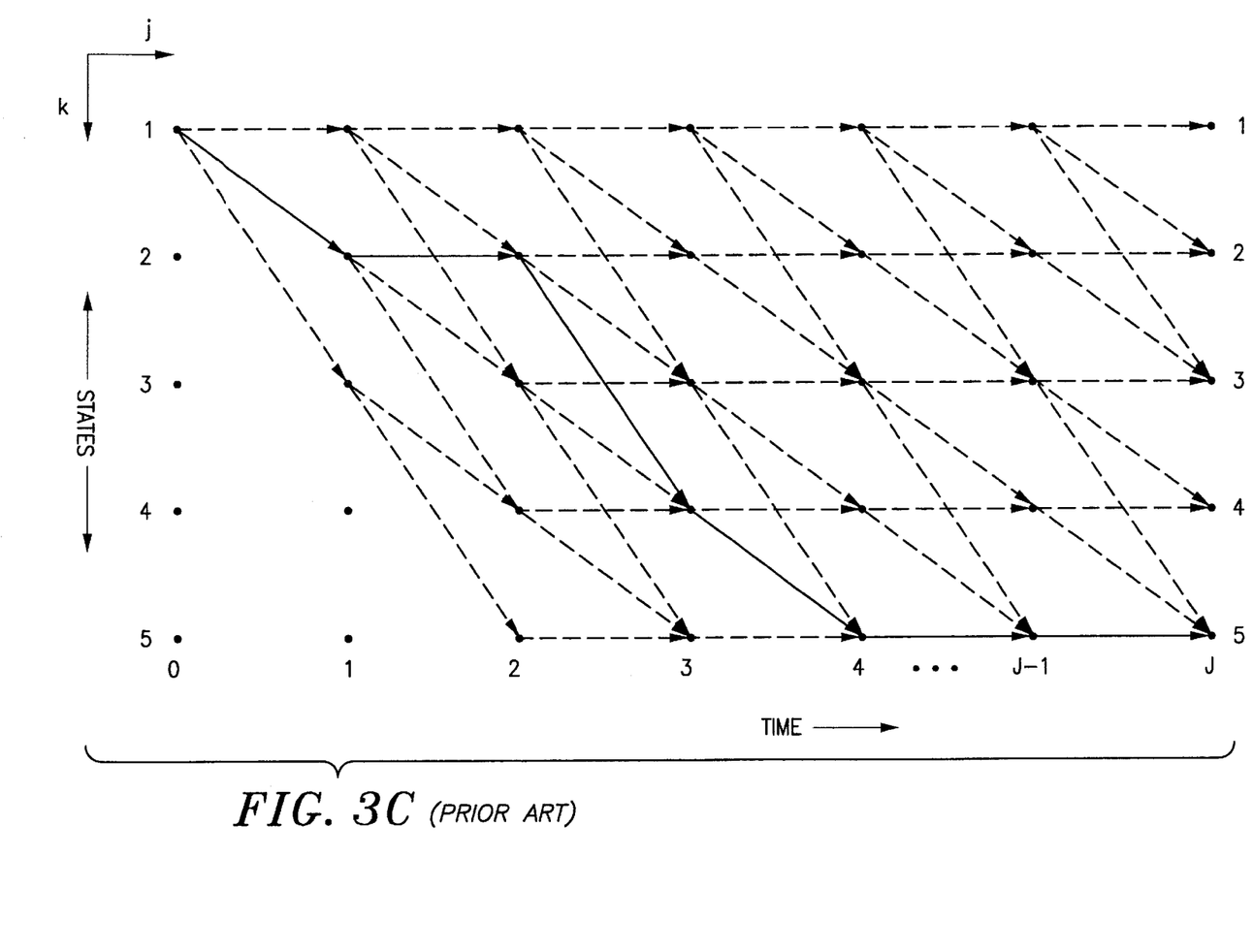
FIG. 3(c) is a trellis diagram of the five-state lattice diagram of FIG. 3(b)

The lattice of FIG. 3(b) may be used as the basis for a trellis, which indicates the evolution of the system as it makes transitions over time. In FIG. 3(c), at each time step k, the set of states is shown vertically, indexed by variable k. Time proceeds from left to right as variable j. The transition from each state at time j−1 to each state at time j is shown by an arrow; a sequence of these arrows defines a path representing the state sequence $q=\{q_1, q_2, \ldots, q_j\}$. Also shown in FIG. 3(c) is the initial condition $q_0=1$. The trellis provides a J×K array and is shown for K states from time 1 to time J. A particular path, indicated by the heavy line, has been indicated as corresponding to the state sequence {1, 2, 2, 4, 5, 5, 5}. For any possible state sequence q, there corresponds a unique path through the trellis, and vice versa.

A distance (or metric) may be defined between the (ideal, noiseless) emitted symbol $C_{xy}$ and a noisy, corrupted received observation $O_j$. This distance, known as a local distance, is a function of $C_{xy}$ and $O_j$ that increases as $C_{xy}$ and $O_j$ become less similar. (In an alternative implementation, the distance is replaced by a probability or similarity, in which lower values indicate less probability that $O_j$ derived from $C_{xy}$ and higher values indicate more similarity between $O_j$ and $C_{xy}$, but only the equivalent case is described and not treated further.) This distance is represented as d(x, y, j)=d and if $C_{xy}=Oj$, then d(x, y, j)=O and if $C_{ab}=O_j$, then d(x,y, j)>O. More specifically, when looking at the local distance of each allowed transition into k, given by a(k), then x→a(k) in state k and y→k, so d (x, y, j)→d[a(k), k, j].

For every path in the trellis, an accumulated distance may be computed as the sum of all local distances along the path. The size of the accumulated distance is indicative of the difference between the particular state sequence defined by the path and the observed symbol sequence. If the observed symbols match the emitted symbols associated with the path exactly, then the accumulated distance is zero for that path, as it is the sum of local distances of value zero.

For any particular node k at time j, there will in general be several paths that reach it, one from each allowed predecessor of that node's predecessor set, a(k). The key concept to the Viterbi algorithm is the fact that Bellman's optimality principle may be applied: rather than keeping track of all possible paths that transition into a state, it is sufficient to merely keep track of the one path entering the state that has the lowest accumulated distance. This lowest-distance path for each node is called the survivor path for that node. The best-scoring (lowest-scoring) path to any node k at time j can be determined from the survivor path to every allowed predecessor node at time j−1, plus the lowest-distance transition into node k. Therefore, to proceed with the computation of all paths through the lattice at time j, given all paths up to time j−1, we proceed as follows for each node at time j:

1. Compute the local distance scores for all transitions into node k:
2. For each allowed predecessor for node k, ask), add the corresponding local distance to the accumulated distance from the predecessor node to produce an updated accumulated distance and updated path.
3. Find the path into node k with the lowest accumulated distance score and select it as the one transition path into node k for time j.
4. Make note of which predecessor had the winning low score and store it for future path traceback.

These steps are repeated for all nodes at time j, and then time is advanced to j+1 and the process is again repeated for all nodes. When time j=J is reached, the process is repeated and then the list of predecessors recorded at step 2 above is traced from j=J to j=1 to reconstruct the state sequence.

More formally, executing the Viterbi algorithm consists of three steps:

1. For each state k at time j, compute the local distance between the received symbol $O_j$, and each ideal noiseless symbol transitioning into k, $C_{xy}$, to produce the set of local distances d(x, y, j).

2. For each path entering a state, add the local distance for that path to the accumulated distance (sum of local distances along the path) and then compare the accumulated distance to the accumulated distance of all other paths entering that state and select the minimum path metrics (k, j):

$$s(k, j)=\min[s(a(k),j-1)+d[a(k),k,j]a(k)$$

where a(k) defines the search range. The value of a that produces the minimum over $$s(a(k), j-1)+d[a(k), k, j] \text{ given by } a=\arg \min[s(k, j)=\min[s(a(k),j-1)+d\ 8\ a(k),k,j]a(k)$$

time t.

Trace the sequence of a values that is stored, one for each input symbol, backward from the end to the beginning to recover the likely sequence of states that led to the observations.

In real time implementation, several other considerations arise. Because the input may be continuous, the computation 3 of the most likely sequence must be conducted at an arbitrary time, rather than waiting until the end of the sequence. Specifically, at any time interval, the best-matching path reaching each state at that time can be traced back to the point at which all paths converge on the same state. Then, all best paths will have the same state sequence from the beginning of the sequence to the last frame of common best-matching path. A basic add-min-argmin-update, also called comfer select or ACS, is used repeatedly in performing the search over accumulated distance and their pattern.

With reference to FIG. 3(c), the traceback process can be mirrored in the Viterbi trellis as rightward shifts with the allowable trellis state transition determining the so-called surviving paths leading to the initial trellis state. The value of a that produces the minimum being stored in a memory location associated with time t, being shifted according to the trellis. Those skilled in the art will understand that the decoder will be controlled by a finite-state machine that will have various states, not to be confused with the trellis states depicted in FIG. 3(c).

Viterbi decoders are used heavily in communications applications for Forward Error Correction (FEC). They undo the encoding of convolutional encoders and correct bit errors. An essential part of the Viterbi decoder is the traceback memory (TM). It stores information about decisions made by Add-Compare-Select Unit (ACSU). For each state of the trellis, the TM contains a circular buffer. The ACSU writes the decision information into the TM, and the Traceback Unit reads that information from the TM and decodes the bit stream.

This invention describes a method for managing the buffers in the TM with reduced hardware and cycle overhead. Instead of maintaining an individual circular buffer for each state (each requiring a start and end address and complicated address generation), every buffer is allowed to shift through the entire memory, and only a few pointers are needed to be maintained and updated.

Heretofore, the TM required separate circular buffers for each state of the Viterbi trellis. For each buffer, a start and an end address needed to be stored. Accesses to these buffers require an address generation unit that checks for overflow and maintains the circular structure. This address generation is costly both in terms of silicon area as well as cycle count.

The decoder of the instant invention is typically implemented at a Random Access Memory (RAM) on a VLSI (Very Large Scale Integrated) chip where space is limited. Those skilled in the art will appreciate that the minimal needs of implementing the Traceback Memory of the instant invention greatly reduces the minimal space and complexity of circuit elements needed.

The invention also includes a method that allows the buffers to change location dynamically within the TM. Read and write address generation can be simplified and, if memory length is a power of two, no hardware or cycle overhead for circular buffers is needed.

Figure 4:
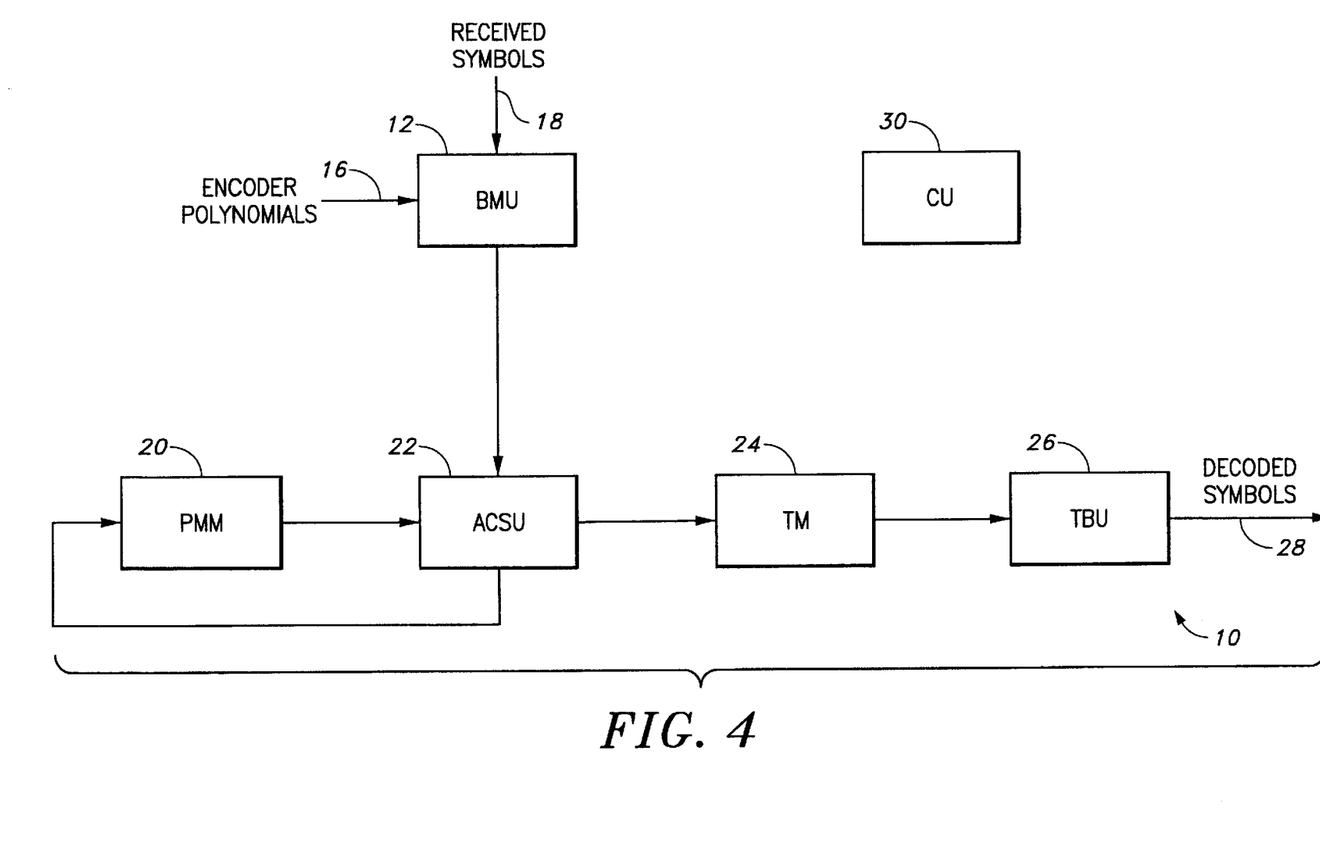
FIG. 4 is a blocl diagram of a Viterbi decoder according to the present invention.

A block diagram of a Viterbi decoder 10 according to the present invention is shown in FIG. 4. The major functional units include a Branch Metric Unit (BMU) 12 which generates the branch metrics based on an encoder polynomial 16 and the received symbol stream 18. A Path Metric Memory (PMM) 20 stores the metric or cost associated with each state of the trellis. An Add-Compare-Select Unit (ACSU) 22 receives the branch metrics from BMU 12 and the trellis state metrics from PMM 20 and calculates the new metrics for the trellis states and decides which branch to keep and which to discard. A Traceback Memory (TM) 24 stores the decision bits generated by the ACSU 22. A Traceback Unit (TBU) 26 performs the traceback and generates a decoded bit stream 28, and the control unit (CU) 30 contains the main state machines and controls the overall operation of the decoder 10. In an alternative embodiment, there could be more than one of each block and the memories could consist of several banks or other partitions.

Two traceback schemes are commonly used: frame based (where the TBU starts operation only after all symbols have been received and all branch decisions have been made) and continuous (where the TBU operates while symbols are being received and decodes continuously). The invention is applicable to both cases, but the advantages would be diminished in the frame based case, since the entire stream of decision bits is stored and circular buffers are not needed.

An important parameter is the traceback length (TBL). It is the number of trellis transitions that the TBU has to trace back before it can decode a bit. It also determines the number of transitions that the TBU has to wait before it can start any traceback after the very first symbol was received by the decoder. After this initial delay of TBL symbols, the decoder operates in a steady state where the following operations are executed simultaneously for each trellis transition: generate new branch metrics, calculate path metrics and decide on which branch to keep, trace back TBL transitions and decode one bit. For each trellis state, all decision bits are stored in a buffer in the TM. During every trellis transition, the ACSU appends a new decision bit at the end of each of these buffers, and the TBU deletes one bit at the beginning of each of the buffers. To save memory, the buffers have heretofore been implemented as circular buffers so that the location of old (deleted) bits can be made available for new bits. Generating an address within one of these circular buffers requires extra hardware. The start and end addresses of the buffer need to be stored in registers, and every address needs to be checked for overflow, which requires adders and multiplexers and consumes extra clock cycles.

The operation of the present invention will be described by reference to FIG. 5. Instead of the circular buffers used in the prior art to store the decision bits for each trellis state, each buffer is allowed to grow linearly, i.e., the ACSU 22 appends new bits at one end and the TBU 26 deletes bits at the other. Since there is no wrap-around, the present invention effectively shifts through the TM, mirroring the trellis state diagram of FIG. 3(c). The TM 24 is arranged as a set of N buffers $32_i$ (i=0, ..., N−1), as shown in FIG. 5.

Figure 5A:
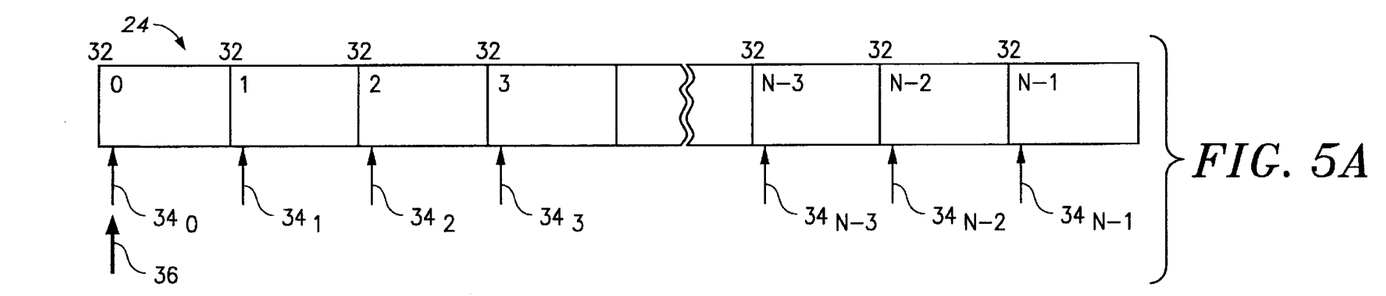
FIG. 5 illustrates the traceback mechanism of the present invention by shifting trellis states within Traceback Memory 24 of FIG. 4.
Figure 5B:
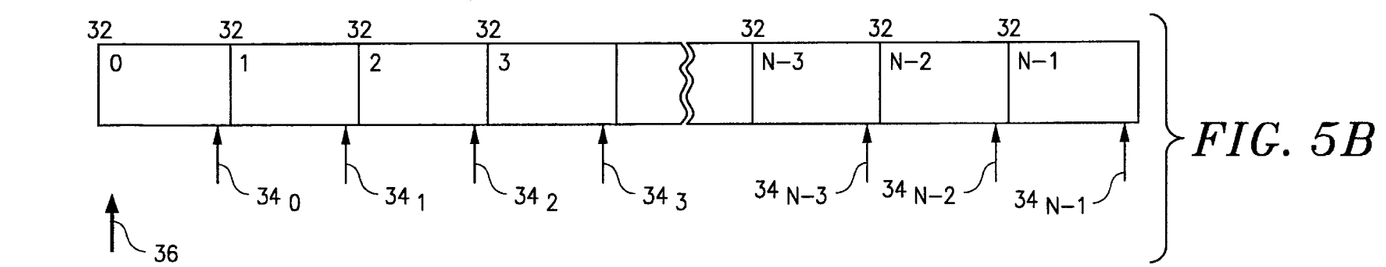
Figure 5C:
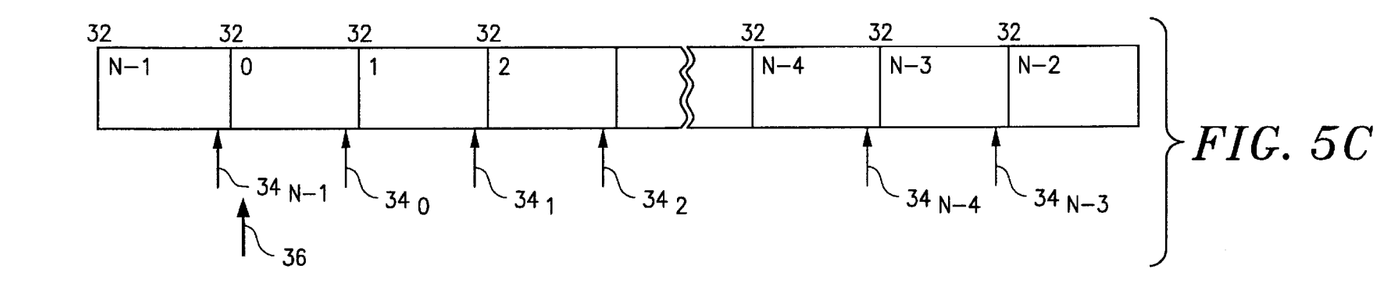

Two types of pointers are maintained within the TM 24: a local write pointer $34_i$ (i=O, ..., N−1) that is used by the ACSU 22 to write the next decision bit and which is post incremented, and a global start pointer 36 that always points to the start of buffer O. The global start pointer is used by the TBU 26 to calculate addresses for traceback. Since the TBU 26 has to access the traceback memory in a random fashion, maintaining individual read pointers for each buffer is not useful. FIG. 5(a) illustrates the beginning of operation with the N buffers. FIG. 5(b) illustrates the situation after receiving the first TBL symbols, i.e., before buffers have shifted and before the TBU has been activated. After the first TBL symbols have been received, TBU 26 is activated and runs the first traceback. All buffer pointers 34 point close to the end of their respective buffers. A buffer must be big enough to hold at least the TBL decision bits, but it can also be longer, for example, the next power of 2 greater than the TBL. Making the buffer length a power of 2 reduces implementation complexity in the address generation circuits. When the next symbol is received, the buffers shift by one bit in the TM 24. The last buffer $3_{2_{N-1}}$, however, cannot shift beyond the end of the TM 24 and wraps around to the beginning, according to the invention. FIG. 5(c) illustrates the situation after the TBU has been activated; more than TBL symbols have been received and the buffers have shifted; the buffer belonging to state N−1 has wrapped around the end of the memory. Thus the invention can be best understood as implementing the traceback trellis diagram (such as in FIG. 3(c)) rotated clockwise by 90 degrees, whereby each trellis state 1, 2, ..., N becomes one buffer $32_i$ (i=O, ..., N−1) and the time axis j=O, ..., J becomes the sequence over time of the GSP 36.

There are two cases of memory lengths, M, to be considered. The first case is when the memory length, M, is a power of 2. The addresses wrap around automatically due to the limited number of address bits, the 'overflow bits' simply are lost in an adder, and no checking or modification of the address is required. Since the number of buffers is equal to the number of states in the trellis, it is always a power of 2. Therefore, the length of a buffer would also have to be a power of 2.

The second case is when the memory length is not a power of 2. This case is more complicated since addresses will not wrap around automatically. The ACSU 22 needs to check the pointers explicitly, but because the first address is always O (as opposed to a random start address), this check can be implemented in a simplified manner. After incrementing the address by 1, the memory length needs to be subtracted, and if the result is zero the new address is replaced by O. This check is necessary whenever the global start pointer or the buffer pointers is changed. There are several advantages in this instance, no base addresses or end addresses for individual buffer are needed, thus saving registers. The maximum allowable address for every buffer is the end address of the memory and is therefore fixed. So when switching between different buffers, this maximum address does not need to be changed.

If the memory length is close to a power of 2, i.e., if very few bits in the binary representation of the value are set to 1, the check can usually be implemented in a very simple way. For example, let the memory length be 768=512+256. Instead of checking the pointer against 768 by subtracting 768, −768 is added modulo 1024 (the next power of 2). Since −768 is 256 in twos-complement notation, only a 2-bit adder is needed to add the upper 2 bits. Thus the impact on area and cycle time can be kept small.

Another possibility to avoid checking the pointers is to increase memory size to a power of 2. The extra memory overhead might be smaller than the cost of adding extra check logic. The buffer length's always the memory size divided by the number of buffers.

The address generation in the TBU 26 is similar. The global start pointer is used as a reference point. If location N in buffer M needs to be read, the address is GSP+TBL*M+N. Similar to the buffer pointers, this result may have to be checked depending on the memory length. Note that the product (buffer length * M) can be implemented in a simple way if the buffer length is a power of 2 (or close to it) so that it requires only shifts or a small number of additions.

General processing flow in the Viterbi decoder 10 of the present invention is:

1. A group of bits 18 is received by the decoder 10.
2. The branch Metric Unit (BMU) 12 calculates the branch metric for the ACSU 22.
3. The ACSU 22 receives the branch metrics from the BMU 12 and the trellis state metrics from the PMM 20 and calculates new path metrics. For each such it also generates decision bits that indicate the selection that was made.
4. The new path metrics are written back into the Path Metric Memory (PMM) 20.
5. The decision bits are stored in the Traceback Memory (TM) 24.
6. A new branch metric is selected and processing continues with step 2 until the path metrics for all trellis states have been updated. Then the decoder goes back to step 1 and receives the next group of input bits.

After some initial delay, the Traceback Unit (TBU) 26 is activated. The TBU traces the history of decision bits back for a predetermined number of iterations and decodes bits that are then output as decoded symbols 28 as follows:

A. The TBU assumes a particular trellis state as initial state.
B. It reads the corresponding decision bit from the Traceback Memory and with that bit calculates the previous trellis state.
C. It iterates step B for a predetermined number of times. At some point, it will generate output bits (decoded bits) from the sequence of trellis transitions.

Figure 6:
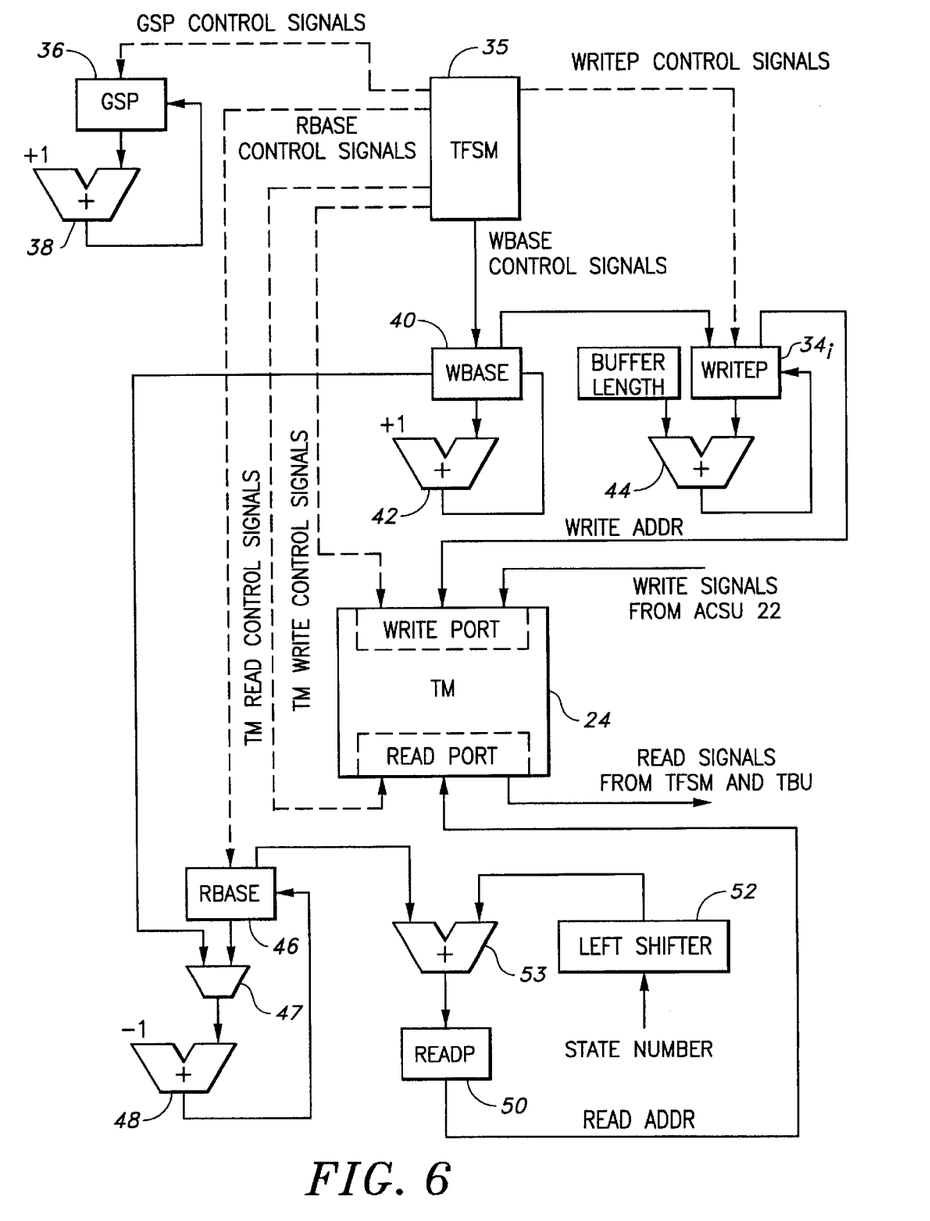
FIG. 6 is a block diagram of the traceback memory buffer management utilizing TM 24 of the present invention.

With reference now to FIG. 6, the TM 24 performs the general signal processing under control of traceback finite state machine (TFSM) control 35 by maintaining a number of pointers in registers. Global Start Point (GSP) 36 always points to the first address of the first buffer $32_0$. It is incremented by an Adder 38 only after the TBU has completed a traceback and decoded bits. For each decoded bit, the GSP is incremented by 1. Write Base Pointer (WBASE) 40 points to the next available empty location in the first buffer $32_0$. It is initialized with the current contents of the GSP and is then incremented by an Adder 42 after each complete update of all path metrics, i.e., after a trellis transition. Local Write Pointer (WRITEP) $34_i$ is the absolute address where the next decision bits coming from the ACSU 22 will be stored. Initially for the first buffer, it is the same as WBASE. As the path metrics are updated one by one and decision bits have to be stored, the WRITEP jumps from buffer to buffer (always pointing to the next empty location in that buffer). Therefore a register $34_i$ contains the buffer length value added to WRITEP. Note that especially when the buffer length is a power of 2, the Adder logic 44 can be greatly simplified. RBASE 46 is initialized at the beginning of a traceback to the last location that was written in the first buffer as selected by a multiplexer 47. During the traceback it is decremented by Adder 48 for every trellis transition. When it finally points to the same location as the GSP, then the traceback is complete. READP 50 points to the absolute address of the state that is being read by the TBU 26. As the TBU traces the decision history back through the trellis, for each transition it reads the decision bit of a particular state. The state number stored in a register 52 together with the RBASE register are combined in an Adder 53 to form the READP value. Note that in the above implementation the buffer length is assumed to be a power of 2, so that the multiplication of the state number with the buffer length can be implemented as a simple left shift operation 52.

The write pointer registers (WBASE and WRITEP) are used to store the decision bits from the ACSU, and the read pointer registers are used to read decision bits while a traceback is being performed. Both operations are completely independent from each other and so it is advantageous if the TM has a read port and an independent write port. It is, however, not necessary, and the entire method can be implemented with only single-ported memory, too. However, some additional arbitration logic would be required.

Numerous variations and modifications will become apparent to those skilled in the art once the above disclosure is fully appreciated. It is intended that the following claims be interpreted to embrace all such variations and modifications.

What is claimed is:

1. Apparatus for Viterbi decoding of an encoded signal represented as a time-sequence of coded symbols, comprising:

a processor receiving said encoded signal and generating therefrom a time-sequence of trellis-state decision records;

a buffer receiving and storing in an array said time-sequence of trellis-state decision records, wherein:

said buffer comprises a plurality of indexed-buffer registers each storing a predetermined one of said plurality of trellis-state decision records;

each such indexed-buffer register responsive to a first and a second write pointer signal;

said first write pointer signal pointing to one of said plurality of indexed-buffer registers as the shifted starting point of said time-sequence array; and said second write pointer signal pointing to the index within each of said buffer registers for storage of said trellis-state decision records; and a traceback unit operatively connected to said buffer tracing back a path in said array representing a most-likely survivor path and generating therefrom a decoded signal.

2. Apparatus for Viterbi decoding according to claim 1 wherein said buffer is a RAM.

3. Apparatus for Viterbi decoding according to claim 1, wherein said first write pointer is incremented by a fixed predetermined value.

4. Apparatus for Viterbi decoding according to claim 3, wherein said second write pointer is incremented by a fixed predetermined value after each said trellis-state decision is generated by said processor.

5. Apparatus for Viterbi decoding according to claim 1, wherein said buffer is further responsive to a read pointer signal pointing to the trellis-state decision being read; said read point signal being formed from a state number of said trellis-state and a read base signal.

6. Apparatus for Viterbi decoding according to claim 5, wherein said read base signal is decremented by a fixed predetermined value after each said trellis-state decision is generated by said processor.

7. Method of Viterbi decoding of an encoded signal represented as a time-sequence of coded symbols, comprising the steps of:

generating from said encoded signals a time-sequence of trellis-state decision records;

storing said records in an array, wherein:

said array comprises a plurality of indexed-buffer registers, each storing a predetermined one of said trellis-state decision records, each such indexed-buffer register responsive to a first write pointer signal and a second write pointer signal;

said first write pointer signal pointing to one of said plurality of indexed-buffer registers as the shifted starting point of said time-sequence array; and said second write pointer signal pointing to the index within each of said buffer registers for storage of said trellis-state decision records; and generating a decoded symbol from traceback paths in said array, wherein:

said first write pointer is incremented by a fixed predetermined value after each said encoded symbol is received; and said second write pointer is incremented by a fixed predetermined value after said trellis-state decision is generated.

8. Apparatus for traceback buffer management and generation of decoded signals, operatively connected between a processor and a traceback unit, comprising:

a control;

a traceback memory (TM) having a read port and a write port, and arranged as a plurality of buffers, each a predetermined length (TBL);

a write address unit connected to said TM write port and responsive to said control, generating a local write pointer signal to a selected buffer in said TM;

a read address unit connected to said TM read port and responsive to said control, generating a read pointer signal for said generation of decoded signals; and a global start pointer (GSP) register responsive to said control, wherein:

said read address unit includes a read base address (RBASE) register responsive to said control;

said RBASE register is decremented after each trellis-state decision;

said generation of a decoded signal occurs when the contents of said RBASE register equals the contents of said GSP register.

9. Traceback memory management apparatus according to claim 8 wherein said write address unit comprises:

a write address register storing said write address pointer signal;

a buffer length register;

a first adder having an output connected to said write address register, receiving said write address pointer signal and a signal from said buffer length register and generating therefrom an updated write address pointer signal;

a write base address register storing a write base pointer signal received from said control; and a second adder having an output connected to said write base address register, receiving said write base pointer signal and said first predetermined incrementing value signal and generating therefrom an updated write base address signal;

wherein said control operatively selects said local write pointer signal from the output of said write address pointer signal or the output of said write base address register.

10. Traceback memory management apparatus according to claim 9, wherein said signal from said buffer length register is a power of 2, and wherein said read address unit further includes:

a read address register storing said read pointer signal;

a register for left-shifting and storing a trellis-state number value;

a first adder having an output connected to said read address register, receiving said read address pointer signal and receiving said shifted trellis-state signal and generating therefrom an updated read address pointer signal;

a multiplexer receiving the signal stored in said write base address register and said signal stored in said read base address (RBASE) register said control operatively selecting therefrom a signal to be generated; and a second adder having an output connected to said read base address (RBASE) register, receiving the signal generated by said multiplexer and a predetermined decrementing value signal and generating therefrom an updated read base address signal.

11. Traceback memory management apparatus according to claim 8 wherein said TM is a RAM.

12. Apparatus for traceback buffer management and generation of decoded signals, operatively connected between a processor and a traceback unit, comprising:

a control;

a traceback memory (TM) having a read port and a write port, and arranged as a plurality of buffers, each a predetermined length;

a write address unit connected to said TM write port and responsive to said control, generating a local write pointer signal to a selected buffer in said TM;

a read address unit connected to said TM read port and responsive to said control, generating a read pointer signal for said generation of decoded signals; and a global start pointer (GSP) register responsive to said control, wherein:

said read address unit includes a read base address (RBASE) register responsive to said control;

said RBASE register is decremented after each trellis-state decision;

said generation of a decoded signal occurs when the contents of said RBASE register equals the contents of said GSP register.

13. Traceback memory management apparatus according to claim 12 wherein said TM is a RAM.

14. Traceback memory management apparatus according to claim 12 wherein said write address unit comprises:

a write address register storing said write address pointer signal;

a buffer length register;

a first adder having an output connected to said write address register, receiving said write address pointer signal and a signal from said buffer length register and generating therefrom an updated write address pointer signal;

a write base address register storing a write base pointer signal received from said control; and a second adder having an output connected to said write base address register, receiving said write base pointer signal and said first predetermined incrementing value signal and generating therefrom an updated write base address signal;

wherein said control operatively selects said local write pointer signal from the output of said write address pointer signal or the output of said write base address register.

15. Traceback memory management apparatus according to claim 14, wherein said signal from said buffer length register is a power of 2, and wherein said read address unit comprises:

a read address register storing said read pointer signal;

a register for left-shifting and storing a trellis-state number value;

a first adder having an output connected to said read address register, receiving said read address pointer signal and receiving said shifted trellis-state signal and generating therefrom an updated read address pointer signal;

a multiplexer receiving the signal stored in said write base address register and said signal stored in said read base address (RBASE) register said control operatively selecting therefrom a signal to be generated; and a second adder having an output connected to said read base address (RBASE) register, receiving the signal generated by said multiplexer and a predetermined decrementing value signal and generating therefrom an updated read base address signal.

* * * * *